United States Patent [19]
Daniel et al.

[11] Patent Number: 5,697,073
[45] Date of Patent: Dec. 9, 1997

[54] APPARATUS AND METHOD FOR SHAPING AND POWER CONTROLLING A SIGNAL IN A TRANSMITTER

[75] Inventors: Christopher John Daniel, Lake Zurich; Kevin Joseph Holoubek, Buffalo Grove, both of Ill.

[73] Assignee: Motorola, Inc., Schaumburg, Ill.

[21] Appl. No.: 297,190

[22] Filed: Aug. 26, 1994

[51] Int. Cl.⁶ .................................................. H01Q 11/12
[52] U.S. Cl. ........................................ 455/126; 455/116
[58] Field of Search .............................. 375/296, 297; 327/106; 330/279, 129, 306, 254; 455/126, 116, 118; 370/347, 442

[56] References Cited

U.S. PATENT DOCUMENTS

| | | |
|---|---|---|
| 4,592,073 | 5/1986 | Watanabe . |
| 4,706,262 | 11/1987 | Ohta . |
| 4,737,968 | 4/1988 | Norton et al. ............... 375/297 |
| 4,956,837 | 9/1990 | Vollmer . |
| 5,101,176 | 3/1992 | Norimatsu . |
| 5,121,081 | 6/1992 | Hori . |
| 5,123,031 | 6/1992 | Kuisma ........................ 375/296 |
| 5,152,008 | 9/1992 | Hori . |
| 5,159,283 | 10/1992 | Jensen ......................... 375/297 |
| 5,179,353 | 1/1993 | Miyake . |
| 5,249,200 | 9/1993 | Chen et al. ................... 375/296 |
| 5,260,973 | 11/1993 | Watanabe . |
| 5,287,555 | 2/1994 | Wilson et al. ................. 455/126 |
| 5,307,512 | 4/1994 | Mitzlaff . |
| 5,309,115 | 5/1994 | Hashimoto et al. ........... 455/126 |
| 5,410,272 | 4/1995 | Haberland et al. ........... 455/126 |
| 5,507,015 | 4/1996 | Karczewski et al. ......... 455/116 |

*Primary Examiner*—Reinhard J. Eisenzopf
*Assistant Examiner*—Marsha D. Banks-Harold
*Attorney, Agent, or Firm*—Richard A. Sonnentag

[57] ABSTRACT

A transmitter architecture is disclosed which offers a new combination of signal shaping and power control which optimizes transmitter noise figure performance. The disclosed apparatus and method is implemented by separating the shaping element (303) from the power control elements (406, 412, 418) in frequency. Placing the shaping element (303) at a fixed intermediate frequency (IF) allows for the use of readily available, temperature stable shaping elements while distributing the power control elements (406, 412, 418) at radio frequency (RF) facilitates optimization of noise figure performance in the transmitter (200).

15 Claims, 2 Drawing Sheets

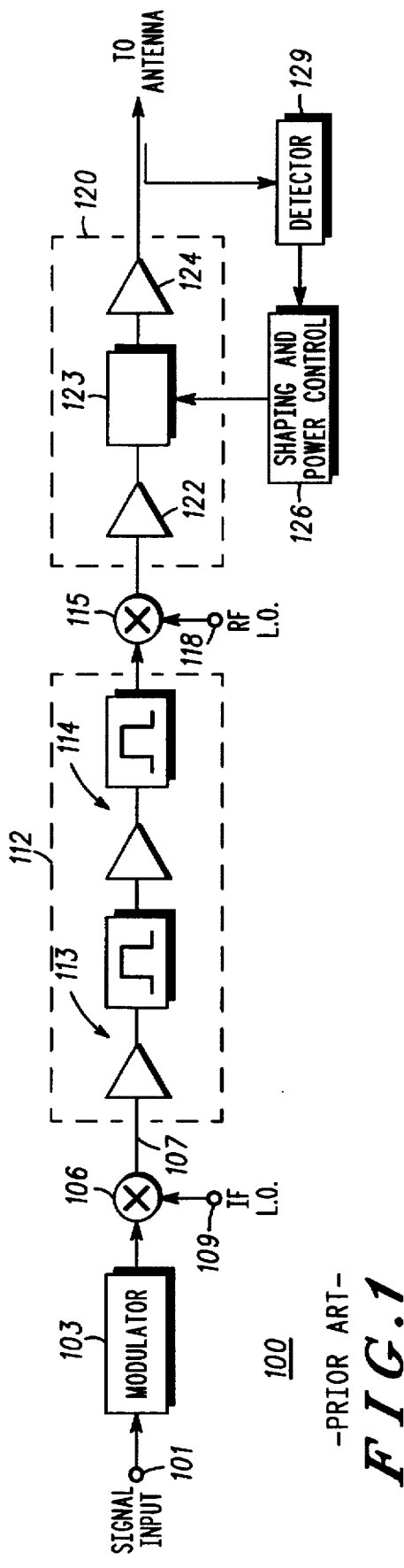
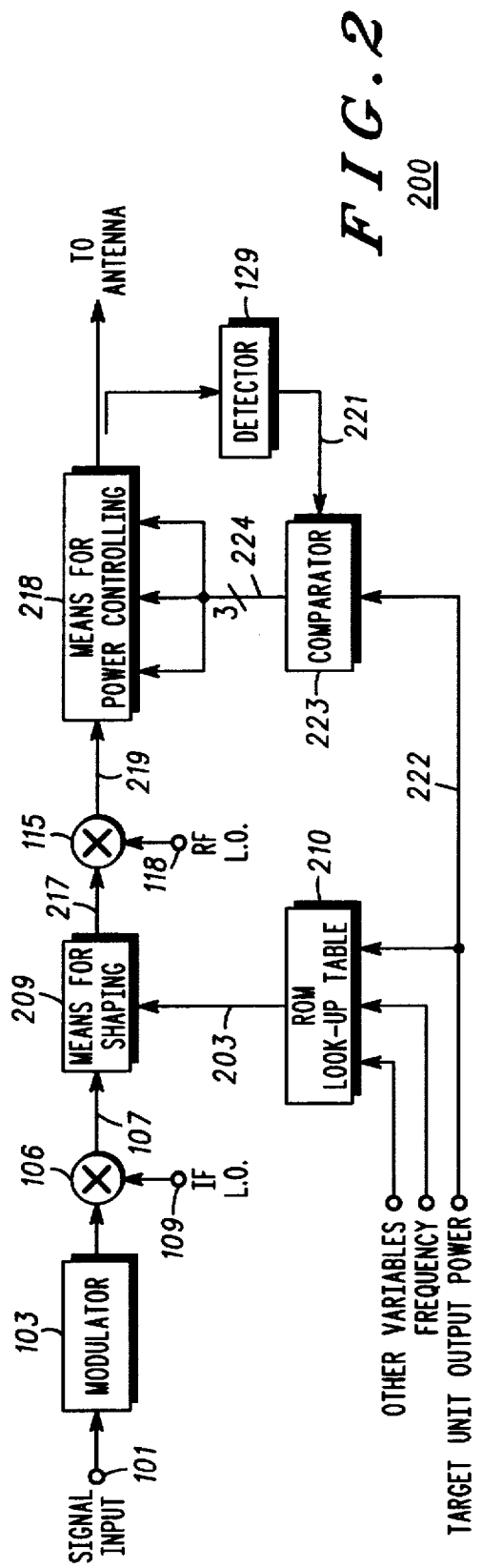

1

APPARATUS AND METHOD FOR SHAPING AND POWER CONTROLLING A SIGNAL IN A TRANSMITTER

FIELD OF THE INVENTION

The present invention relates generally to transmitters and, in particular, to shaping and power controlling signals in such transmitters.

BACKGROUND OF THE INVENTION

The European Telecommunications Standards Institute (ETSI) Radio Transmission and Reception specifications (GSM 05.05) for transmitter output radio frequency (RF) spectrum are very stringent. The requirements for spurious emissions, spectrum due to wideband noise, and spectrum due to switching transients require careful architecting of the transmitter's power control, on/off waveform shaping control, and noise figure line-up. Recently, the above requirements have been made even more severe with respect to the wideband noise requirement. A summary of the architecture requirements imposed by GSM 05.05 are presented below to provide a perspective on the magnitude of the dynamic range and wideband noise performance that is required.

SWITCHING TRANSIENTS

Precise control of the shape of the RF output voltage waveform is necessary to ensure compliance with the switching specifications. This precision control is further complicated when synthesizer based frequency hopping is employed. For this case, approximately 42 decibels (dB) of transmitter ramping range is necessary to satisfy the spectrum due to switching transients requirements. In the base-station transmitter, the transmitter must ramp down, switch synthesizers, and ramp up, all during the guard time between time slots, approximately 30 microseconds (µs). As a point of comparison, a mobile station is allowed the full guard time to perform only the ramp up or ramp down function.

POWER CONTROL

GSM 05.05 requires the base station transmitter to have 12 dB of static output power control for purposes of adjusting cell size. If downlink power control is supported, up to 30 dB of additional range is required. The switching transient specifications must be met over at least the 12 dB of static adjust range. Consequently, a minimum of 54 dB (12 dB+42 dB) of control range is necessary. In a practical transmitter implementation, additional control range is required to account for frequency variation, build tolerances and changes in operating environment.

SPURIOUS EMISSIONS

The in-band spurious emissions is specified to be less than −36 decibels relative to 1 milliWatt (dBm) peak power in a 100 kilohertz (kHz) bandwidth when measured at carrier frequency offsets greater than 6 MegaHertz (MHz). Output power of a typical base-station transmitter is +43 dBm. For additive white Gaussian noise, a correction factor of approximately −14 dB must be applied to the measured peak power to obtain a reasonably accurate estimate of the average noise power. Therefore, the transmitter noise performance at maximum output power must be better than −93 decibels relative to the carrier power (dBc) average power in a 100 kHz bandwidth (−93=−36−43−14). Accounting for component tolerances, gain variation with frequency, and temperature effects, inter alia, a carrier-to-noise (C/N) design goal of better than −100 dBc is necessary.

WIDEBAND NOISE

The wideband noise requirements from GSM 05.05 for carrier frequency offsets of greater than 6 MHz is −80 dBc in a 100 kHz bandwidth referenced to the modulated carrier as measured in a 30 kHz bandwidth. The actual carrier power is typically 8 dB higher than this reference level resulting in a noise requirement of −88 dBc. This requirement holds as the transmitter is power controlled down until the absolute measured power reaches a specified noise floor. At that point, it must be ensured that this floor is not exceeded as the transmitter is further power controlled down. The wideband noise specification, in conjunction with spurious emissions, effectively dictates how the transmitter's noise figure is allowed to degrade as it is power controlled down. For a GSM 900 transmitter, the specified noise floor is −65 dBm at the antenna connector of the base-station. The output power at which −88 dBc equals this absolute noise floor is +23 dBm for such transmitters, which equates to an output power range of 20 dB when the maximum output power is +43 dBm. This is the range (20 dB) over which the −88 dBc requirement must be met.

As the transmitter power is controlled, the noise figure of the gain stage line-up degrades when power control occurs at elements closest to the low power gain stages (i.e., closest to the input signal to be amplified). As a consequence, conventional transmitter designs are not adequate to meet the severe wideband noise specifications while maintaining compliance to the other requirements.

As if the requirements above were not enough, several other design aspects must also be considered. The control element utilized (the element used for both shaping and power control) requires high dynamic range. As a consequence, a high degree of board isolation is required so that the conducted path is not affected. These two characteristics, although achievable, are very expensive. In addition, the control element utilized must be very stable over temperature, frequency, and during dynamic ramping operation. Compensation of the transmitter's transfer function is performed by predistorting the ramp waveform, and any errors in this predistortion result in a greater spectral spread. Consequently, any error introduced by the control must be minimized, and/or eliminated, so as to allocate all margin for error to the transmitter's PA.

Thus a need exists for a transmitter arrangement which meets cost, isolation and stability requirements while meeting the rigid requirements for transmitter performance imposed by any number of industry standards.

BRIEF DESCRIPTION OF THE DRAWINGS

FIG. 1 generally depicts, in block diagram form, a prior art transmitter arrangement.

FIG. 2 generally depicts a transmitter for shaping and power controlling a signal in accordance with the invention.

DETAILED DESCRIPTION OF A PREFERRED EMBODIMENT

Figure 3:
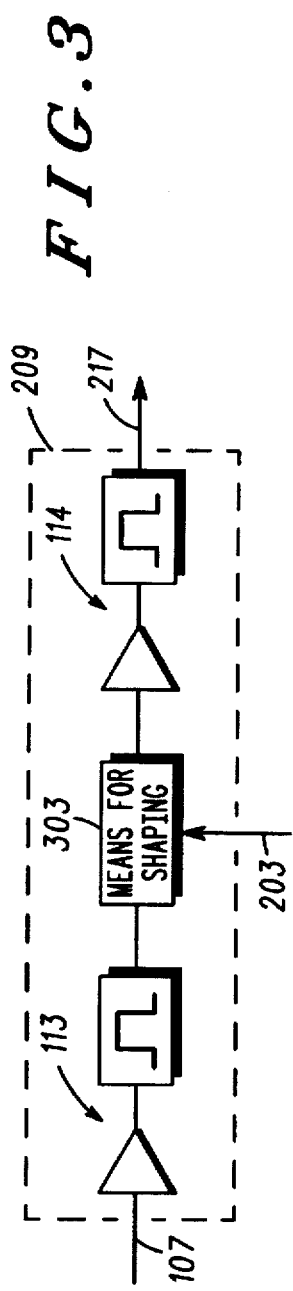
FIG. 3 generally depicts, in greater detail, the means for shaping of FIG. 2 in accordance with the invention.

A transmitter architecture is disclosed which offers a new combination of signal shaping and power control which optimizes transmitter noise figure performance. The disclosed apparatus and method is implemented by separating the shaping elements from the power control elements in frequency. Placing the shaping element at a fixed intermediate frequency (IF) allows for the use of readily available, temperature stable shaping elements while distributing the power control elements at radio frequency (RF) facilitates optimization of noise figure performance in the transmitter.

Generally, the transmitter 200 comprises a means for shaping 209 a modulated signal input 107 to produce a shaped modulated signal 219 and means, which is coupled to the means for shaping 209, for power controlling 218 the shaped modulated signal 219. The means for shaping 209 further comprises means for controlling the ramp-up and ramp-down characteristics of the modulated signal input as required by GSM 05.05. The means for power controlling 218 and the means for shaping 209 are independent of one another.

Means for shaping 209 utilizes, as input, output 203 from a read only memory (ROM) look-up table 210. Generally, the ROM look-up table 210 provides shaping information, based on a desired output characteristic of the transmitter 200, to means for shaping 209 as to how to shape modulated signal input 107. However, ROM look-up table 210 also provides, as output, pre-distortion shaping information to the means for shaping 209 based on desired output characteristics of the transmitter 200. These output characteristics of the transmitter 200 include, but are not limited to, target output power of the transmitter 200, output frequency of the transmitter, temperature compensation information, etc.

FIG. 1 generally depicts, in block diagram form, a prior art transmitter 100. As depicted in FIG. 1, a signal input 101 is modulated by a modulator 103 and provided to a mixer 106 which mixes the modulated signal input up to an intermediate frequency (IF) by IF local oscillator (LO) 109. The modulated signal input 107 at IF is passed through block 112 where it is amplified and filtered by each of amplifier/filter stages 113, 114. The amplified/filtered signal exiting block 112 enters mixer 115 and is mixed up to a radio frequency (RF) by mixing it with RF LO 118. The signal entering block 120 is further amplified and enters control element 123 which provides both shaping and power control functions. Control element 123 is the limiting factor in design of the prior art transmitter 100 in that element 123 alone must meet all the requirements as stated in the background of the invention. Control element 123, when used in prior art transmitter 100, is not capable of meeting the recently imposed, severe requirements with respect to wide band noise (while meeting all other specifications).

FIG. 2 generally depicts a transmitter for shaping and power controlling a signal in accordance with the invention. As depicted in FIG. 2, transmitter 200 physically separates the signal shaping from the signal power control so that the shaping requirements of GSM 05.05 are met while likewise meeting all other requirements as specified, including the severe wide band noise requirements. Elements common to the transmitter of FIG. 1 and FIG. 2 have elements with common numbering.

The operation of transmitter 200 of FIG. 2 is as follows. Signal input 101 is modulated and mixed to an IF to produce modulated signal input 107 as described above in relation to FIG. 1. However, unlike the circuitry of FIG. 1, modulated signal input 107 enters means for shaping 209 which provides shaping of modulated signal input 107 as required by GSM 05.05. Means for shaping 209 further comprises means for controlling the ramp-up and ramp-down characteristics of modulated signal input 107. Means for shaping 209 performs its shaping function by utilizing, as input, output from a read only memory (ROM) look-up table 210. Depending on inputs such as frequency, target output power, and other variables (if necessary), ROM look-up table 210 provides input to means for shaping 209 to properly shape modulated signal input 107 in accordance with GSM 05.05.

Means for shaping 209 produces a shaped modulated signal 217 which is mixed to RF via mixer 115 and RF LO 118. The shaped modulated signal is now at RF and is represented by signal 219. Signal 219 enters means for power controlling 218, which utilizes a closed loop power control scheme via detector 129 to produce feedback signal 221, and to consequently provide power level control. Feedback signal 221 enters a comparator 223, as does a target output power signal 222, and signals 221 and 222 are compared by comparator 223. Comparator 223 outputs signal 224, which then adjusts means for controlling 218 to produce an output signal at the target output power. The resulting output signal is fed to an antenna (not shown) for subsequent transmission to a user. Important to note is that transmitter 200 of FIG. 2 may be beneficially utilized in a base-station transmitter, subscriber unit transmitter, or any other device which has similarly severe requirements for dynamic range, spectral purity, wideband noise, etc.

FIG. 3 generally depicts, in greater detail, means for shaping 209 in accordance with the invention. As shown in FIG. 3, modulated input signal 107 enters amplifier/filter stage 113 as shown in FIG. 1, but now the signal exiting stage 113 is input into shaping element 303. Also input into shaping element 303 is control signal 203, which is output from ROM look-up table 210 of FIG. 2. Control signal 203 provides shaping information to shaping element 303 as to how to properly shape modulated signal 107 in accordance with GSM 05.05. In the preferred embodiment, shaping element is implemented using a linear multiplier. Output of shaping element 303 enters amplifier/filter stage 114 as shown in FIG. 1. Signal 217 exiting means for shaping 209 is shaped modulated signal 217.

Figure 4:
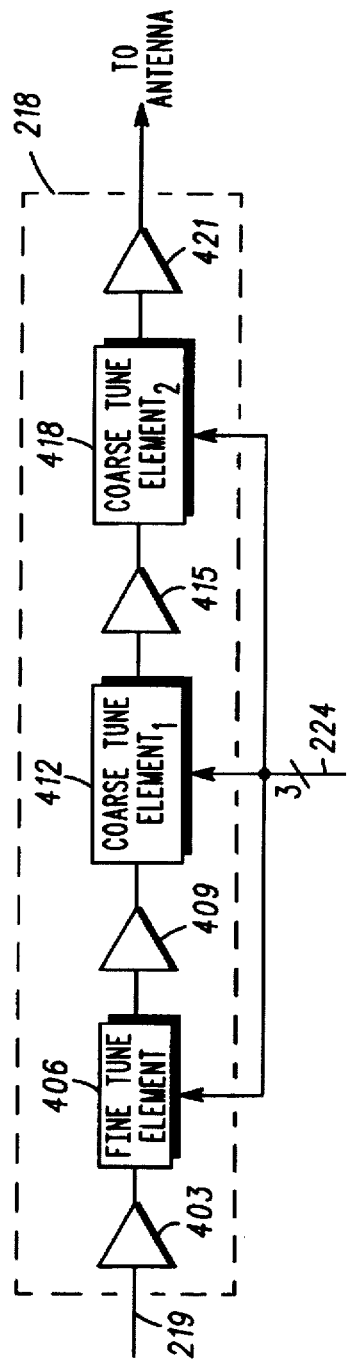
FIG. 4 generally depicts, in greater detail, the means for power controlling of FIG. 2 in accordance with the invention.

FIG. 4 depicts, in greater detail, means for power controlling 218 in accordance with the invention. The means for power controlling 218 is a distributed power control arrangement utilizing adjustable elements. As depicted in FIG. 4, shaped modulated signal 219 enters block 218 and is amplified by amplifier $A_1$ 403. Output from $A_1$ 403 is input into a Fine Tune Element 406, which in the preferred embodiment is an analog voltage variable attenuator (VVA) such as a Gallium Arsenide Field Effect Transistor (GaAs FET) VVA. Output from element 406 is input into amplifier $A_2$ 409 whose output is then input into Coarse Tune Element$_1$ 412. In the preferred embodiment, Coarse Tune Element$_1$ 412 is a digital stepped attenuator, having 30 dB of attenuation steppable in a single 30 dB increment. The signal exiting Coarse Tune Element$_1$ 412 enters amplifier $A_3$ 415 and the signal exiting $A_3$ 415 enters Coarse Tune Element$_2$ 418. In the preferred embodiment, Coarse Tune Element$_2$ 418 has 30 dB of attenuation steppable in fifteen 2 dB increments. Each of Coarse Tune Elements 412 and 418 may be implemented with a GaAs FET discrete digital attenuator. The signal exiting Coarse Tune Element$_2$ 418 enters a power amplifier (PA) 421 which amplifies its input signal, resulting in a signal output of PA 421 which is transmitted to a user via an antenna (not shown).

Since shaping element 303 is at IF, it is much easier to implement a linear transfer function ($V_{out}$ vs. $V_{control}$). Therefore, the entire transmitter chain up to the PA 421 is linear. Then, only the non-linearities in PA 421 itself would actually be compensated in the shaping pre-distortions. As previously described, provision can be made to choose a different predistorted shaping waveform, stored in ROM look-up table 210, as a function of, inter alia, target output power and/or frequency exiting PA 421. This mechanism compensates for changes in the transfer characteristic of transmitter 200 as a function of these two variables. As one of ordinary skill in the art will appreciate, other variables may likewise be compensated using this technique.

As stated above, means for power controlling 218 comprises a distributed power control arrangement. That is, multiple elements are utilized for power control adjustment, as opposed to a single element for adjusting (e.g., element 123 of FIG. 1). In the preferred embodiment, an adjustable Fine Tune Element 406 precedes an adjustable Coarse Tune Element$_1$ 412. In the distributed power control arrangement of the preferred embodiment shown in FIG. 4, Fine Tune Element 406 is placed early in the chain due to its low power-handling capabilities. While Fine Tune Element 406 is expected to be utilized most often, comparator 223, utilizing a microprocessor, orchestrares the setting of each element (406, 412, 418) as required in the preferred embodiment to optimize the noise figure performance of transmitter 200. Although Fine Tune Element 406 is expected to be utilized most often, its position early in the chain does not significantly degrade noise figure performance due to its small adjustment step-size. While attenuators have been described for elements 406, 412 and 418, one of ordinary skill in the art will appreciate that any adjustable element may be utilized (e.g., inter alia, an adjustable amplifier).

Figure 5:
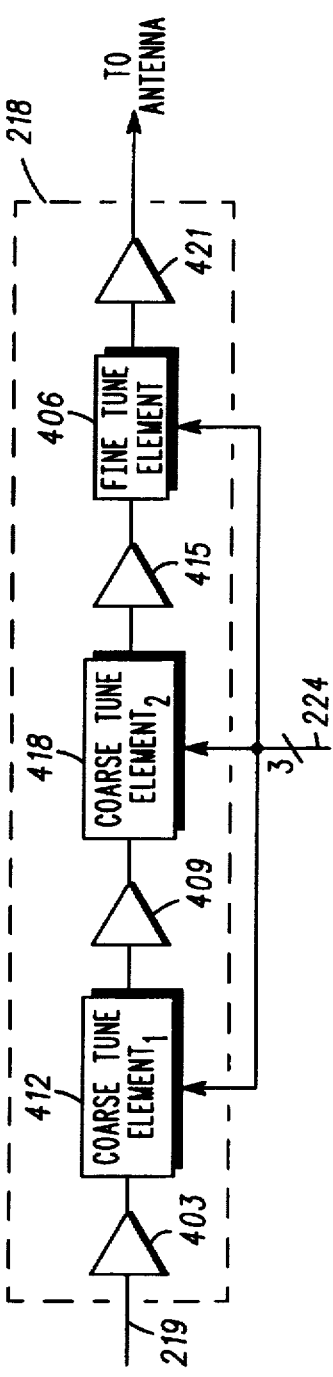
FIG. 5 depicts an alternate embodiment of the means for power controlling of FIG. 2 in accordance with the invention.

FIG. 5 depicts an alternate embodiment of means for power controlling 218 in accordance with the invention. In this ideal embodiment, adjustable Coarse Tune Element$_2$ 418 precedes adjustable Fine Tune Element 406. When adjustment to means for power controlling 218 is made via signal 224, Fine Tune Element 406 is adjusted first and Coarse Tune Elements 412 and 418 are adjusted last if necessary. This introduces as much gain ahead of the control elements as possible to keep the noise figure in the chain as low as possible. Again, as in the preferred embodiment of FIG. 4, comparator 223, utilizing a microprocessor, orchestrares the setting of each element (406, 412, 418) as required to optimize the noise figure performance of transmitter 200 in this embodiment.

The transmitter configuration of FIG. 2 is particularly well suited to a time division multiple access (TDMA) transmitter. As previously stated, both dynamic range and noise figure performance are critical (and stringent) requirements to be met by transmitter 200 of FIG. 2. Since means for power controlling 218 is separated from means for shaping 209, the dynamic range of the shaping element 303 is confined to be approximately 42 dB, a range which has been shown to be required for acceptable switching transient performance as dictated by GSM 05.05. Elements 412 and 418 of means for power controlling 218 are moved forward towards PA 421 and are realized with, for example, digital step attenuators capable of withstanding high power levels. This clearly benefits the noise figure of transmitter 200 as it is power controlled since there is greater gain to take over the noise contribution of the control elements in this configuration. Since the dynamic range of shaping element 303 is now fixed in the transmitter 200 of FIG. 2, the power exiting mixer 115 is always ramped-up to the same power level independent of any power control setting (to means for power controlling 218) via control signal 224. Consequently, a maximum carrier-to-noise (C/N) is provided at the input of means for power controlling 218 during the active portion of the TDMA time slot.

What we claim is:

1. A transmitter for use in a communication system, the transmitter comprising:

a linear multiplier utilizing input from a ROM look-up table to accordingly shape a modulated signal input at an intermediate frequency to produce a shaped modulated signal; and a set of series-coupled voltage variable attenuators, coupled to the linear multiplier, for power controlling the shaped modulated signal to a predetermined output power level.

2. The transmitter of claim 1 wherein the communication system is a time division multiple access (TDMA) communication system.

3. The transmitter of claim 1 wherein the predetermined output power level is referenced to an output of a power amplifier.

4. A transmitter comprising:

a shaping element utilizing input from a look-up table to accordingly shape a modulated signal input to produce a shaped modulated signal at IF;

a mixer having as an input the shaped modulated signal at IF and having as an output a shaped modulated signal at radio frequency (RF); and a power control arrangement, including an adjustable element and having as an input the shaped modulated signal at RF and having as an output an amplified, power-controlled signal at RF.

5. The transmitter of claim 4 wherein the power control arrangement and the shaping element are independent of one another.

6. The transmitter of claim 4 wherein the look-up table further comprises a read only memory (ROM) look-up table.

7. The transmitter of claim 6 wherein the read only memory (ROM) lookup-table provides, as an output, shaping information to the shaping element based on a desired output characteristic of the transmitter.

8. The transmitter of claim 7 wherein the shaping information further comprises pre-distortion shaping information based on a desired output characteristic of the transmitter.

9. The transmitter of claim 8 wherein a desired output characteristic of the transmitter further comprises target output power of the transmitter.

10. The transmitter of claim 8 wherein a desired output characteristic of the transmitter further comprises output frequency of the transmitter.

11. The transmitter of claim 4 wherein the power control arrangement further comprises a distributed power control arrangement including a plurality of adjustable elements.

12. The transmitter of claim 11 wherein the distributed power control arrangement further comprises an adjustable coarse tune element preceding an adjustable fine tune element.

13. The transmitter of claim 11 wherein the distributed power control arrangement further comprises an adjustable fine tune element preceding an adjustable coarse tune element.

14. A method comprising the steps of:

shaping based on input from a look-up table to produce a shaped modulated signal at IF;

mixing the shaped modulated signal at IF to produce a shaped modulated signal at RF; and power controlling, via a power control arrangement which includes an adjustable element, the shaped modulated signal at RF to produce a shaped, power controlled signal at RF.

15. The method of claim 14 wherein the step of power controlling is independent of the step of shaping.

* * * * *